United States Patent [19]
Cameron

[11] Patent Number: 5,363,196
[45] Date of Patent: Nov. 8, 1994

[54] APPARATUS FOR MEASURING A DEPARTURE FROM FLATNESS OR STRAIGHTNESS OF A NOMINALLY-PLANE MIRROR FOR A PRECISION X-Y MOVABLE-STAGE

[75] Inventor: John F. Cameron, Los Altos, Calif.

[73] Assignee: Ultratech Stepper, Inc., San Jose, Calif.

[21] Appl. No.: 819,424

[22] Filed: Jan. 10, 1992

[51] Int. Cl.$^5$ .............................................. G01B 9/02
[52] U.S. Cl. ..................................... 356/358; 356/363
[58] Field of Search ................ 356/357, 358, 363, 345

[56] References Cited

U.S. PATENT DOCUMENTS

| | | | |
|---|---|---|---|
| 3,796,494 | 3/1974 | Takabayashi | 356/358 |
| 3,885,875 | 5/1975 | Rosenfeld et al. | |
| 4,053,231 | 10/1977 | Fletcher et al. | |
| 4,655,594 | 4/1987 | Wittekoek et al. | 356/363 |
| 4,843,563 | 6/1989 | Takahashi et al. | |
| 4,883,357 | 11/1989 | Zanoni et al. | 356/363 |
| 4,910,679 | 3/1990 | Takahashi et al. | |
| 5,064,289 | 11/1991 | Bockman | 356/363 |

Primary Examiner—Samuel A. Turner
Attorney, Agent, or Firm—George J. Seligsohn

[57] ABSTRACT

By providing redundant interferometer laser-metering devices, either one of which is capable by itself of providing measurement data of the angular value $\theta$ of rotation of the X-Y movable stage of a wafer stepper about a vertical Z axis for use by a computer-controlled servo devices that controls the operation of the X-Y movable stage, the servo devices, in a calibration mode, may receive data of specific measurements defining the respective values of undesired departures from flatness or straightness of the nominally-plane mirror surfaces of the the X-Y movable stage. These specific measurements, which may be made quickly at any time without disturbing the stage's mirrors, will also include those departures induced only at the point of use of the mirror and permit the stored control data used by the computer-controlled servo devices to be modified in order to compensate for these undesired departures from flatness or straightness of the nominally-plane mirror surfaces of the X-Y movable stage.

11 Claims, 2 Drawing Sheets

PRIOR ART

APPARATUS FOR MEASURING A DEPARTURE FROM FLATNESS OR STRAIGHTNESS OF A NOMINALLY-PLANE MIRROR FOR A PRECISION X-Y MOVABLE-STAGE

BACKGROUND OF THE INVENTION

1. Field of the invention

This invention relates to apparatus for precisely positioning an X-Y movable stage with respect to a fixed base and, more particularly, to wafer-stepper apparatus employed in the photolithographic manufacture of monolithic integrated circuits.

2. Description of the Prior Art

In the photolithographic manufacture of monolithic integrated circuits, (1) a wafer comprising a given material, such as silicon or GaAs, is fixed to an X-Y movable wafer stage, and (2) a microscopically-sized configuration of a particular one of a number of stacked layers of an integrated circuit being manufactured is successively photographically imaged and exposed at each of a large plurality of separate specified die sites on the wafer surface, with the wafer being stepped with respect to the image focus from die site to die site by the X-Y movable stage. It is essential that all of the number of stacked layers of a manufactured integrated circuit be precisely in proper alignment with one another at each and every one of the large plurality of separate specified sites on the wafer surface. In order to accomplish this required precision, the displacement of the X-Y movable stage carrying a wafer for the purpose of photolithography is commonly transduced using laser interferometry.

Although it is desirable to move the stage as quickly and precisely as possible during this process to maximize the productivity and yield of the integrated circuits being manufactured, one well known process of achieving this required precise alignment fails to achieve this quick stage movement. In accordance with this well known process, the X-Y stage is commanded to step to a first specified die site and a wafer alignment system is employed to measure the offset between the location of that first die site on the wafer and the focused image produced by the stepper optics. This information is then used to fine position the wafer stage before the exposure. This exact-alignment process is then repeated for each and every one of the large plurality of separate specified die sites on the wafer surface. However, wafer alignment measurements and the consequent repositioning of the wafer stage at every exposure site consumes valuable time that detracts from productivity.

Performing wafer alignment operations on just a few, dispersed die sites on the wafer allows the scale and rotation of the X and Y axes of the entire, previously exposed, layer to be characterized. This information can be used by a wafer stage, that is precise enough, to "blind step" through the rest of the sites without performing the wafer alignment operations at each site. This method of alignment is called Enhanced Global Alignment (EGA). This EGA capability would also be valuable if an alignment target were obscured, but the stepper apparatus could reliably expose such a site anyway.

Laser metering, employing interferometers, is used by a movable wafer stage to measure its spatial position. Such laser metering requires that the wafer stage be equipped with relatively long, narrow plane mirrors. A large source of error that affects the precision of a wafer stage is the straightness or flatness of its plane mirrors. It is not practical to purchase mirrors that have been manufactured to very exacting tolerances. Even if they could be made precise enough, they would be very expensive and, further, small temperature changes and mechanical mounting might cause changes in them after the fact. By mapping the surface of a mirror in situ, all of the aforementioned straightness and flatness errors present can be measured. This permits suitable software algorithms to be used to compensate for such errors.

Current mirror mapping techniques employ a phase measuring interferometer with an expanded wave front to analyze the surface of the mirror. However, these systems are very expensive and longer mirrors would incur extra errors, since, assuming a given limited field of view of a phase-measuring interferometer, the measurements would have to be made by patching together discrete measurements. These systems also require the use and maintenance of reference surfaces. Furthermore, these approaches are more suited for the plane measurement of large area surfaces, as opposed to the linear measurement of a long, narrow mirror surface.

The present invention is directed to a mirror-surface profiler which permits such straightness and/or flatness mirror-surface errors to be quickly and precisely measured at any time.

SUMMARY OF THE INVENTION

The present invention is directed to improved apparatus for use in a combination comprising an X-Y movable stage that includes a first nominally-plane surface (which may be a mirror surface) having a longitudinal dimension oriented substantially parallel to an X-axis of the stage and a second nominally-plane surface (which also may be a mirror surface) having a longitudinal dimension oriented substantially parallel to a Y-axis of the stage oriented orthogonal to the X axis thereof.

The improved apparatus, which measures the departure of the surface profile of at least a given one of the stage's first and second surfaces from being flat and straight, comprises first, second and third means. The first means, in response to first control thereof, linearly moves the stage with respect to a reference position solely in a direction substantially parallel to the longitudinal dimension of the given one of the first and second surfaces, in turn, to each of a first plurality of predetermined positions. The second means, which is cooperatively positioned with respect to the given one of the first and second surfaces, measures at each of the first plurality of predetermined positions a first value of the rotational angular position of the stage about at least a given one of its X, Y and Z axes, where the Z axis is oriented orthogonal to both said X and Y axes. The third means which is cooperatively positioned with respect to the other one of the stage's first and second surfaces redundantly measures at each of the first plurality of predetermined positions a second value of the rotational angular position of the stage about the given one of its X, Y and Z axes. This results in the difference between the respective first and second angular values of the rotational position of the stage about the given one of its X, Y and Z axes at each of the first plurality of predetermined positions being a measure at that predetermined position of the departure of the surface profile of that given one of its first and second surfaces from being flat and straight.

DESCRIPTION OF THE PREFERRED EMBODIMENTS

Figure 1:
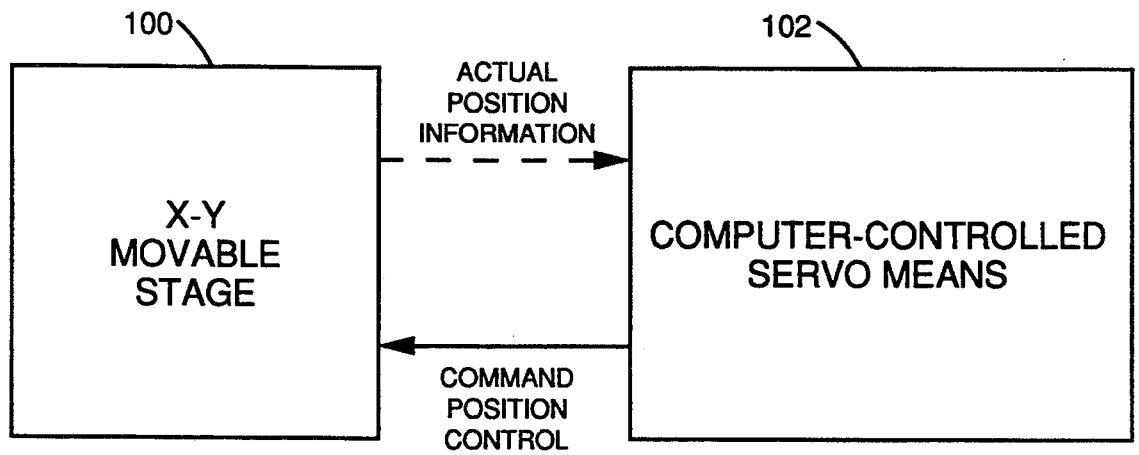
FIG. 1 is a functional block diagram indicating the use, known in the prior art, of a generalized type of computer-controlled servo means to efficiently determine the position of of an X-Y movable stage.

Referring to FIG. 1, there is shown a X-Y movable stage 100 which is moved, with respect to a fixed base (not shown), to a particular X, Y coordinate position (in a substantially horizontal plane) in accordance with command position control signals received from computer-controlled servo means 102. Computer-controlled servo means 102, like all servo means, is fed back information as to the then-existing actual position of X-Y movable stage 100, and then uses the error between this then-existing actual position and the command position to control the movement of stage 100 in X and/or Y directions so as to reduce this error to substantially zero. However, servo means 102, because it is computer-controlled, is capable of accomplishing this and other tasks in a sophisticated manner.

Specifically, computer-controlled servo means 102 normally includes an analog-to-digital (A/D) converter (unless the actual position information is already in digital form), a digital computer processing unit (CPU), memory means, and a stored program (which may comprise software) for controlling the operation of the CPU. Actual position information data from stage 100 may be directly stored in memory, may be processed by the CPU before being stored in memory and/or may be employed, either before or after such processing, to modify the stored program. Further, computer-controlled servo means 102 may have manual data input means for selecting any one of different stored programs therein for the purpose of choosing any one of a plurality of separate modes of command-position control operation for stage 100. For example, in addition to including a stored program for implementing its normal operating mode for controlling the movement for stage 100, computer-controlled servo means 102 also may include a stored program for implementing a certain calibration-mode operation of movement for stage 100. Alternatively, the stored program itself may automatically choose such a calibration-mode operation at certain specified programmed times. In general, the computer control of servo means 102 permits any desired mode of operation thereof to be realized in determining the command position control signals applied to stage 100 and/or in processing the actual position information data received from stage 100.

Figure 2:
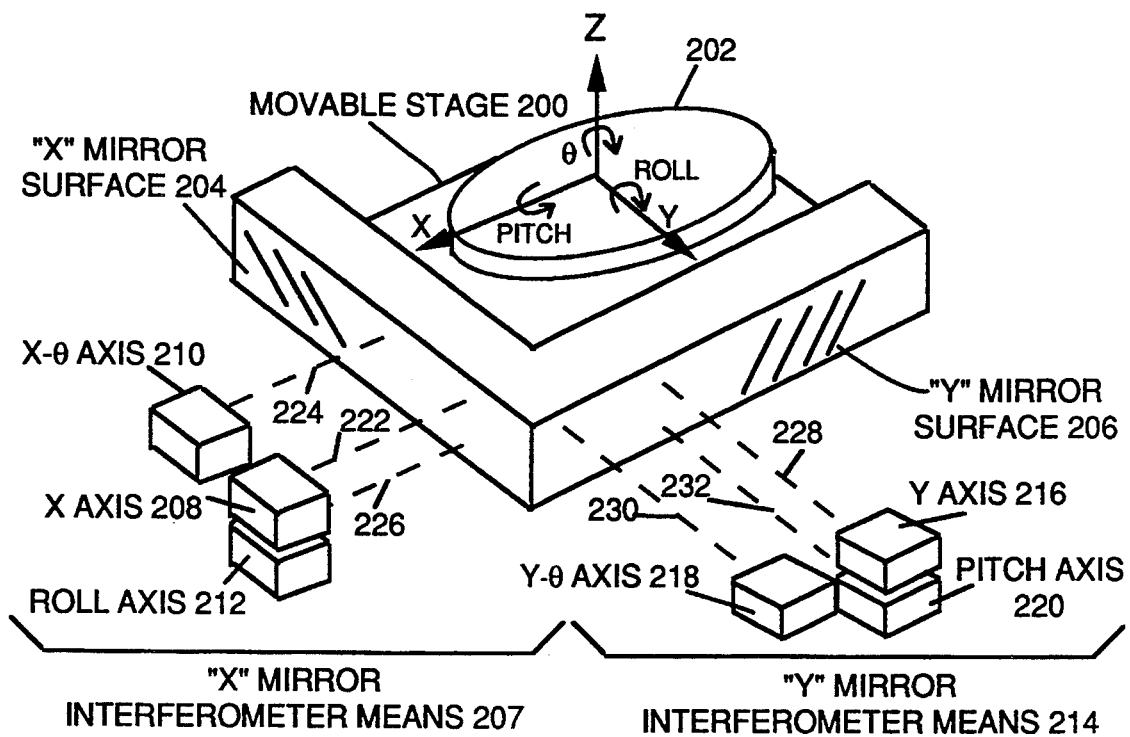
FIG. 2 illustrates an embodiment of the interferometer means of the present invention, which interferometer means may be operated as a high-precision mirror profiler for measuring straightness and flatness errors in the surface of long, narrow "X" and "Y" mirrors that form part of a movable wafer stage.

Referring now to FIG. 2, there is shown movable stage 200 of a wafer stepper. Stage 200, which comprises wafer chuck 202 for supporting a wafer to be photolithographed with each of a plurality of monolithic integrated circuit layers, nominally-plane "X" mirror surface 204 and nominally-plane "Y" mirror surface 206, are all part of the same rigid body. As indicated in FIG. 2, stage 200 is capable of translational motion relative to a fixed base of the wafer stepper with respect to each of the three mutually orthogonal axes X, Y and Z (where the axes X and Y are substantially horizontally oriented and the axis Z is substantially vertically oriented). Further, stage 200 is capable of rotational motion about each of axes X, Y and Z. Rotation about the X axis is defined as "pitch"; rotation about the Y axis is defined as "roll"; and rotation about the Z axis is defined as $\theta$.

In order to be able to move stage 200 with great precision in translation and/or rotation with respect these six axes, stage 200 is preferably levitated by a magnetic field and supported vertically by an air bearing. By controlling the strength and spatial magnetic-field characteristics in accordance with position command control signals from a computer-controlled servo means, any desired translational and/or rotational position of stage 200 can be repeatedly achieved and maintained with extremely small positional error.

Fixedly attached to the fixed base for movable stage 200 of the wafer stepper apparatus are diagrammatically-shown "X" mirror interferometer means 207, comprising resident X axis interferometer 208, X-$\theta$ axis interferometer 210 and roll axis interferometer 212, and "Y" mirror interferometer means 214, comprising resident Y axis interferometer 216, Y-$\theta$ axis interferometer 218 and pitch axis interferometer 220.

As known in the art, the interference of a laser-light reference beam in an interferometer with coherent laser light that has traveled to and been reflected back from the surface of mirror 204 or 206 one or more times is capable of providing a precise measure, accurate to a fraction of a wavelength of the coherent laser light, of the distance from that interferometer to that reflecting mirror surface. In FIG. 2, the respective total travel path lengths of the beam of coherent laser light associated each of interferometers 208, 210 and 212 are schematically represented by dashed lines 222, 224 and 226 extending from its associated interferometer to "X" mirror surface 204, and the respective total travel path lengths of this coherent laser light associated each of interferometers 216, 218 and 220 are schematically represented by dashed lines 228, 230, and 232 extending from its associated interferometer to "Y" mirror surface 206. By way of example, each of these interferometers may be conventional heterodyne double doppler type interferometers or homodyne fringe counting interferometers. Such interferometers are capable of accurately measuring increments of path-lengths as small as 1.25 nanometers.

While stage 200 may be capable of translational movement in the Z (i.e., vertical) direction, there is normally no need to provide precise, laser-metered path-length data to provide control thereof. However, as is known in the art, it is usual to provide a computer-controlled servo means, in its normal operating mode, with laser-metered path-length data information from each of the X axis, the Y axis, the roll axis, and the pitch axis interferometers, as well as one (but not both) of the X-$\theta$ axis and the Y-$\theta$ axis interferometers, to precisely control the movement of movable stage 200 to a particular command position with respect to each of these five axes. Specifically, the X axis interferometer path length data by itself may be used by the servo means to translationally position stage 200 in the X direction, and the Y axis interferometer path length data, by itself, may be used by the servo means to translationally position stage 200 in the Y direction. The offset difference in path-length data between the X axis interferometer and the roll axis interferometer, in conjunction with the fixed distance between these interferometers, may be used by the servo means to rotationally position stage 200 about the roll axis; and the offset difference in path-length data between the Y axis interferometer and the pitch axis interferometer, in conjunction with the fixed distance between these interferometers, may be used by the servo means to rotationally position stage 200 about the pitch axis. Additionally, either the offset difference in path-length data between the X axis interferometer and the X-$\theta$ axis interferometer or, alternatively, the offset difference in path-length data between the Y axis interferometer and the Y$\theta$ axis interferometer may be used by the servo means, in conjunction with the fixed distance between the respective interferometer pair, to rotationally position stage 200 about the $\theta$ axis. Therefore, providing redundant X-$\theta$ axis interferometer 210 and Y-$\theta$ axis interferometer 218 appears foolish, since only one of them is all that is required to rotationally position stage 200 about the $\theta$ axis. However, it is the provision of redundant X-$\theta$ axis and Y-$\theta$ axis interferometers that makes possible the many benefits of the plane mirror profiler of the present invention.

In accordance with the principles of the present invention, the computer-controlled servo means, in addition to having a normal operating mode of the type described above for actively determining the position of movable stage 200 with respect to all of the X, Y, roll, pitch and $\theta$ axes, also provides a mirror-calibration mode for determining the straightness and flatness of each of the long, narrow "X" and "Y" mirror surfaces 204 and 206.

When operating in its mirror-calibration mode, the laser-metered data from Y axis interferometer 216 may be used by the computer-controlled servo means to actively control the linear movement of stage 200 in the Y direction, in turn, to each one of a large plurality of predetermined spaced positions. The total travel distance of stage 200 in the Y direction is sufficient to bring beams 222 and 224 of X axis and X-$\theta$ axis interferometers 208 and 210, in turn, into cooperative relationship with each of successive pairs of points on "X" mirror surface 204 over nearly the entire length of "X" mirror surface 204, thereby permitting the "X" mirror surface offset-data value at each of the large plurality of predetermined spaced positions to be independently determined by the computer-controlled servo means. Placing these two interferometers at the same height with respect to the X mirror surface allows both beams to pass over the same points for most of the mirror length and thereby prevents any pitch or roll errors from influencing the measurement. At the same time, the offset data between the Y axis and Y-$\theta$ axis interferometers 216 and 218 is used by the computer-controlled servo means to actively prevent the $\theta$ value of movable stage 200 from changing (preventing any $\theta$ rotation about the Z axis) during the total travel distance of stage 200 in the Y direction. Thus, since the respective points of contact of each of beams 228 with "Y" mirror surface 206 remains the same and is unaffected by linear movement of movable stage 200 solely in the Y direction, any difference in "X" mirror surface 204 offset-data values at each of the large plurality of predetermined spaced positions only can be due to errors in the flatness or straightness of the nominally-plane "X" mirror surface 204.

In a similar manner, errors in the flatness or straightness of the nominally-plane "Y" mirror surface 206 can be ascertained by the computer-controlled servo means actively controlling the linear movement of stage 200 in the X direction, in turn, to each one of a large plurality of predetermined spaced positions, while the offset data between the X axis and X-$\theta$ axis interferometers 208 and 210 is used by the computer-controlled servo means to actively prevent the $\theta$ value of movable stage 200 from changing during the total travel distance of stage 200 in the X direction.

Figure 2A:
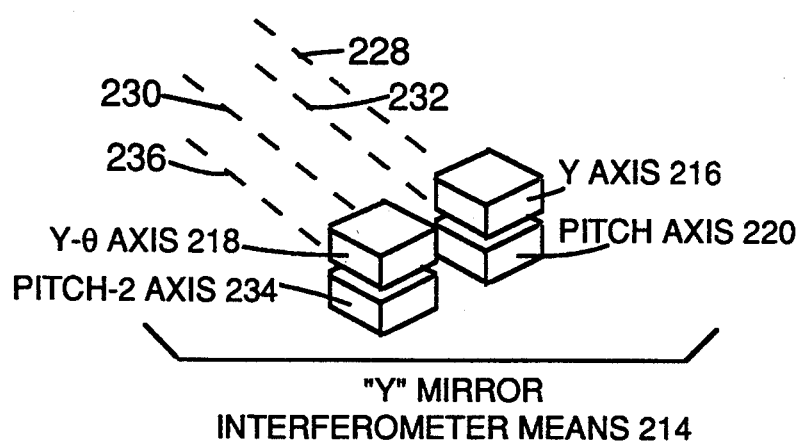
FIG. 2a illustrates a modification of the embodiment of the interferometer means of FIG. 2.

If desired, a redundant pitch-2 interferometer 234 and the beam of coherent laser light 236 associated therewith (shown in FIG. 2a) could be employed to measure twist in "Y" mirror surface 206 and/or a similar redundant roll-2 interferometer and the beam of coherent laser light associated therewith could be employed to measure twist in "X" mirror surface 204. However, because of the long, narrow aspect ratio of both "X" mirror surface 204 and "Y" mirror surface 206, determination of pitch and/or roll errors (twist) of the mirror surfaces may not be worth pursuing. The reason for this is that experience has shown that the only significant departure from flatness and straightness of either mirror is normally just a slight concave or convex bowing of mirror length about one point of inflection.

In any event, the computer-controlled servo means operating in its mirror-calibration mode, after employing all the data supplied to it from "X" mirror interference means 207 and "Y" mirror interference means 214, to map the respective error from flatness and/or straightness at each individual examined point of the nominally-plane "X" and "Y" mirror surfaces 204 and 206, may then use this map to modify the stored command position information accordingly to thereby compensate for the respective error from flatness or straightness of the nominally-plane mirror surfaces.

It is not possible to directly measure offset over the entire length of either mirror to the very ends thereof because the offset measurement at any point requires data from both the longitudinally displaced X and X-$\theta$ axis interferometers 208 and 210 in the case of "X" mirror surface 204 and longitudinally displaced Y and Y-$\theta$ axis interferometers 216 and 218 in the case of "Y" mirror surface 206. However, the computer-controlled servo means, using the measured error values at each individual point that can be directly measured, may interpolate a smooth error curve therefrom using a well-known least-square best-fit algorithm, and then extend the smooth curve with extrapolated error values all the way out to each end of the mirrors. The error values used to modify the stored command position information to compensate for the respective error from flatness or straightness of the nominally-plane mirror surfaces may then be derived from the extended smooth curve.

In practise, the present invention allows the wafer stepper and stage to be completely assembled before the mirrors are mapped in situ. Since experience has shown that the deformations of the mirrors tend to be simple with only one point of inflection, recalibration measurements having modest resolution require only minutes to account for mirror changes that may have occurred with time, temperature or after some mechanical adjustment.

The final mirror mechanical specifications can actually be loosened, resulting in a saving which can help offset the cost of the investment in a redundant interferometer. Thus, the wafer can be positioned precisely enough to allow it to be exposed without the extra delay incurred by wafer alignment operations at each step site. This allows a calibration operation to be performed any time without additional equipment or set up time. The resulting system of the present invention now has the "blind stepping" precision required for operation in an EGA mode, which offers excellent system productivity and robustness.

In the preferred embodiments of the present invention described above, it is assumed that in the process of mapping the flatness and straightness errors of the "X" mirror surface, the computer-controlled servo means is capable of employing the offset data between the Y axis and Y-$\theta$ axis interferometers 216 and 218 to actively prevent the $\theta$ value of movable stage 200 from changing during the total travel distance of stage 200 in the Y direction, and similarly in the process of mapping the flatness and straightness errors of the "Y" mirror surface, is capable of employing the offset data between the X axis and X-$\theta$ axis interferometers 208 and 210 to actively prevent the $\theta$ value of movable stage 200 from changing during the total travel distance of stage 200 in the X direction. However, this capability of the computer-controlled servo means is not essential to the present invention.

A cruder implementation of an X-Y movable stage may not be provided with means for rotating the stage about any of the roll, pitch and $\theta$ axes, so that there is no way to prevent slight changes in the value of $\theta$ as the stage is linearly moved between successive ones of the large plurality of predetermined spaced positions in either the Y or the X direction during the mirror calibration mode of operation. However, because the measurement of $\theta$ offset is redundant in the present invention, the effect of any undesired $\theta$ rotation on the measurement of flatness and straightness error any point of either the "X" or "Y" mirrors 204 and 206 may be eliminated by taking into account the difference between the measured X-$\theta$ and Y-$\theta$ offsets. Specifically, any change in the individual contact point on "Y" mirror 206 by each of beams 228 and 230 due to $\theta$ rotation is negligible during the entire mapping of "X" mirror surface 204. Therefore, subtracting the Y-$\theta$ offset from the X-$\theta$ offset at each mapped point provides the straightness and flatness error at that point of "X" mirror surface 204. Similarly, during the mapping of "Y" mirror surface 206, subtracting the X-$\theta$ offset from the Y-$\theta$ offset at each mapped point provides the straightness and flatness error at that point of "Y" mirror surface 206.

The preferred embodiments of the present invention employ interferometers using laser metering to precisely measure distances. However, broadly, the implementation of the principles of the present invention do not demand that distance measurement be accomplished only by means of interferometers using laser metering. Any other type of distance-measuring means may be employed that is capable of providing, in any given case, the amount of measurement precision that is required in such given case.

What is claimed is:

1. In the combination comprising an X-Y movable stage that includes a first nominally-plane surface having a longitudinal dimension oriented substantially parallel to an X-axis of said stage and a second nominally-plane surface having a longitudinal dimension oriented substantially parallel to a Y-axis of said stage oriented orthogonal to said X axis thereof, and apparatus for measuring the departure of the surface profile of at least a given one of said first and second surfaces from being flat or straight; the improvement wherein said apparatus comprises:

first means, in response to first control thereof, linearly moving said stage with respect to a reference position solely in a direction substantially parallel to the longitudinal dimension of said given one of said first and second surfaces, in turn, to each of a first plurality of predetermined positions;

second means cooperatively positioned with respect to the given one of said first and second surfaces for measuring at each of said first plurality of predetermined positions a first value of the rotational angular position of said stage about at least a given one of its X, Y and Z axes, where the Z axis is oriented orthogonal to both said X and Y axes; and third means cooperatively positioned with respect to the other one of said first and second surfaces for redundantly measuring at each of said first plurality of predetermined positions a second value of the rotational angular position of said stage about said given one of said X, Y and Z axes;

whereby the difference between the respective first and second angular values of the rotational position of said stage about said given one of said X, Y and Z axes at each of said first plurality of predetermined positions is a measure at that predetermined position of the departure of the surface profile of that given one of said first and second surfaces from being flat or straight.

2. The combination defined in claim 1, wherein:

said first means, in response to second control thereof, linearly moves said stage solely in a direction substantially parallel to the longitudinal dimension of said other one of said first and second surfaces, in turn, to each of a second plurality of predetermined positions;

said third means measures at each of said second plurality of predetermined positions a third value of the rotational angular position of said stage about said given one of said X, Y and Z axes; and said second means redundantly measures at each of said second plurality of predetermined positions a fourth value of the rotational angular position of said stage about said given one of said X, Y and Z axes;

whereby the difference between the respective third and fourth values of the rotational angular position of said stage about said given one of said X, Y and Z axes at each of said second plurality of predetermined positions is a measure at that predetermined position of the departure of the surface profile of that other one of said first and second surfaces from being flat and straight.

3. The combination defined in claim 2, wherein: said given one of said X, Y and Z axes is said Z axis and the rotational angular position of said stage about said Z axis is $\theta$.

4. The combination defined in claim 3, wherein:

each of said first and second nominally-plane surfaces comprises a mirror surface;

said second means comprises first optical measurement means, which is fixed in position with respect to said reference position, for measuring the distance from it to one point on the rotational angular position $\theta$ of said stage about a Z axis, and second optical measurement means, which is fixed in position with respect to said reference position, for measuring the distance from it to another point on said given one of said first and second nominally-plane mirror surfaces displaced by a first displacement distance from said one point thereof, wherein the line determined by said one and said other points of said given one of said first and second nominally-plane mirror surfaces is oriented substantially parallel to the longitudinal dimension of that mirror surface; and said third means comprises third optical measurement means, which is fixed in position with respect to said reference position, for measuring the distance from it to one point on said other one of said first and second nominally-plane mirror surfaces, and second optical measurement means, which is fixed in position with respect to said reference position, for measuring the distance from it to another point on said other one of said first and second nominally-plane mirror surfaces displaced by a second displacement distance from said one point thereof, wherein the line determined by said one and said other points of said other one of said first and second nominally-plane mirror surfaces is oriented substantially parallel to the longitudinal dimension of that mirror surface;

whereby the difference between the respective distances measured respectively by said first and second optical measurement means at each of said first plurality of predetermined positions is indicative of the angular value of the rotational position $\theta$ of said stage about said Z axis at thai predetermined position, and the difference between the respective distances measured respectively by said third and fourth optical measurement means at each of said second plurality of predetermined positions is indicative of the angular value of the rotational position $\theta$ of said stage about said Z axis at that predetermined position.

5. The combination defined in claim 4, wherein:

each of said first, second, third and fourth optical measurement means comprises an interferometer for laser-metering the distance measured thereby.

6. The combination defined in claim 4, wherein:

said first means comprises a computer-controlled servo means for controlling the movement of said stage;

wherein said computer-controlled servo means, in response to said measurement at each of said first plurality of predetermined positions by said second means and said measurements at each of said second plurality of predetermined positions by said third means, (1) directly computes said departure values of the mirror surface profile of each of said first and second mirror surfaces from being flat or straight at each of said first and second plurality of predetermined positions thereof, (2) extrapolates from these computed departure values effective departure values for mirror-surface points situated within said first displacement distance from either end of the length of said given one of said first and second nominally-plane mirror surfaces and said second displacement distance from either end of the length of said other one of said first and second nominally-plane mirror surfaces, and (3) employs each of both said directly-computed and extrapolated effective departure values to modify the control of the movement of said stage to compensate for the departure of said departure of the nominally-plane mirror-surface profile of each of said first and second mirror surfaces from being flat or straight.

7. The combination defined in claim 1, wherein:

said given one of said X, Y and Z axes is said Z axis and the rotational angular position of said stage about said Z axis is $\theta$.

8. The combination defined in claim 7, wherein:

said given one of said first and second nominally-plane surfaces comprises a mirror surface;

said second means comprises first optical measurement means, which is fixed in position with respect to said reference position, for measuring the distance from it to one point on the rotational angular position $\theta$ of said stage about a Z axis, and second optical measurement means, which is fixed in position with respect to said reference position, for measuring the distance from it to another point on said given one of said first and second nominally-plane mirror surfaces displaced by a given displacement distance from said one point thereof, wherein the line determined by said one and said other points of said given one of said first and second nominally-plane mirror surfaces is oriented substantially parallel to the longitudinal dimension of that mirror surface;

whereby the difference between the respective distances measured respectively by said first and second optical measurement means at each of said first plurality of predetermined positions is indicative of the angular value of the rotational position $\theta$ of said stage about said Z axis at thai predetermined position.

9. The combination defined in claim 8, wherein:

each of said first and second optical measurement means comprises an interferometer for laser-metering the distance measured thereby.

10. The combination defined in claim 8, wherein:

said first means comprises a computer-controlled servo means for controlling the movement of said stage; and wherein said computer-controlled servo means, in response to said measurements at each of said first plurality of predetermined positions by said second means, (1) directly computes said departure values of the mirror surface profile of each of said first and second mirror surfaces from being flat or straight at each of said first and second plurality of predetermined positions thereof, (2) extrapolates from these computed departure values effective departure values for mirror-surface points situated within said displacement distance from either end of the length of said given one of said first and second nominally-plane mirror surfaces and (3) employs each of both said directly-computed and extrapolated effective departure values to modify the control of the movement of said stage to compensate for the departure of said departure of the nominally-plane mirror-surface profile of each of said first and second mirror surfaces from being flat or straight.

11. The combination defined in claim 1 wherein:

said combination comprises a wafer stepper incorporating said X-Y movable stage.

* * * * *